United States Patent [19]

Plumb

[11] Patent Number: 5,315,104
[45] Date of Patent: May 24, 1994

[54] PHOTODIODE PHOTODETECTOR WITH ADJUSTABLE ACTIVE AREA

[75] Inventor: Richard G. Plumb, Suffolk, England, IP8 3OO

[73] Assignee: BT&D Technologies, Ipswich, Suffolk, England

[21] Appl. No.: 946,473

[22] PCT Filed: Apr. 30, 1991

[86] PCT No.: PCT/GB91/00693
§ 371 Date: Nov. 10, 1992
§ 102(e) Date: Nov. 10, 1992

[87] PCT Pub. No.: WO91/17571
PCT Pub. Date: Nov. 14, 1991

[30] Foreign Application Priority Data

May 1, 1990 [GB] United Kingdom ............... 9009753

[51] Int. Cl.⁵ .................................................. H01J 40/14
[52] U.S. Cl. ..................................... 250/214.1; 257/465
[58] Field of Search .......... 250/214.1, 214 PR, 214 R; 257/465, 448, 457, 431, 436; 359/189, 152; 372/46, 50

[56] References Cited

U.S. PATENT DOCUMENTS

| | | | |
|---|---|---|---|
| 2,896,086 | 7/1959 | Wunderman | 250/214 PR |
| 3,193,686 | 7/1965 | Heinz | 250/214.1 |
| 3,214,591 | 10/1965 | Hadley | 250/214.1 |
| 3,885,151 | 5/1975 | Tokushima | 250/214.1 |

Primary Examiner—David C. Nelms
Assistant Examiner—Que T. Le
Attorney, Agent, or Firm—Nixon & Vanderhye

[57] ABSTRACT

The output of semiconductor optical sources is monitored by a photo detector including a photodiode having a photosensitivity which is less than the total active area of the device. Conveniently these active areas may be arranged in groups. The electrical output of selected areas or groups of areas or both may be arranged to be enabled or disabled as appropriate to provide the required photo responsivity of the device.

28 Claims, 3 Drawing Sheets

PHOTODIODE PHOTODETECTOR WITH ADJUSTABLE ACTIVE AREA

BACKGROUND OF THE INVENTION

1. Field of the Invention

This invention relates to photo detectors and has an important application in monitor detectors for optical sources.

2. Related Art

Optical sources such as lasers for use in optical communication systems, for example, usually need to provide optical output power which varies little over time and between nominally identical devices. Typically, to achieve this stability and repeatability, an optical-electrical control loop is employed, in which a small fraction of the optical output of the source is directed onto the active area of a monitor photo-detector mounted in a suitable position relative to the optical source. The monitor converts the incident optical signal into an electrical output signal which is representative of the optical output of the source. This electrical signal is then, in turn, employed to control the optical source. In the case of a semiconductor laser optical source, for example, a common arrangement is to monitor the light emerging from the back facet of the laser and use the resulting electrical signal to control the drive current of the laser.

The monitored fraction of the optical output power depends very sensitively on a number of device and constructional parameters, making it difficult if not impossible to fix the photodiode characteristics in relation to a particular laser device. On the one hand, to alleviate the problems of positioning the photo-detector relative to the optical source the region over which the detector is photo-sensitive should be fairly large. A large photo-sensitive region also provides the required slow response of the monitor device, which ought to respond only to relatively slow changes in the average output, but not to the very rapid changes corresponding to modulation of the output of the optical source. On the other hand, large devices tend to be optically very sensitive, and in many instances prove to be too sensitive. Conventional methods to lower this responsivity by moving the photo-detector towards glancing incidence and off the axis of the monitored light beam, or reducing the size of its photo sensitive region or both, incur penalties in terms of the positional tolerance and the stability with temperature as the far field pattern of the optical source changes.

Further problems with conventional arrangements arise from the fact that the coupling efficiency into a fibre varies widely with the exact fibre lens parameters. The user is usually interested in monitoring the optical power coupled with the fibre rather than the actual power generated by the laser. If the monitor diode is pre-aligned to the laser, differences in coupling efficiency from laser to fibre will cause a large variation in the parameter of interest.

SUMMARY OF THE INVENTION

The present invention proposes an approach which helps to alleviate problems of the aforementioned kind.

According to one aspect of the present invention, a photo-detector has a photo-sensitive region which comprises a plurality of distinct photo responsive "active" areas arranged to permit selective enabling or disabling of one or more of these active areas.

Conveniently an active area is arranged to be enabled or disabled by respectively making and breaking electrical connection between it and another active area or an electric output terminal arrangement, or both.

According to a another aspect of the present invention a monitor photo detector comprises a photodiode having a photo-sensitive region comprising plurality of spaced active areas, thereby to provide a device region capable of exhibiting photo responsivity which is less than the total active area of the device. Conveniently these active areas may be arranged in groups. The electrical output of selected areas or groups of areas or both may be arranged to be enabled or disabled as appropriate to provide the required photo responsivity of the device.

According to another aspect of the present invention, a photo-detector has a plurality of photo-responsive areas in a photo-responsive region such that the ratio (the fill factor) of the total photo-responsive area to the surface area of the photo-responsive region is less than 1.

Preferably the photo-detector comprises a first active area having a first surface area greater or less than the surface area of another active area. Active areas may be arranged in groups.

Conveniently, the active areas of different groups of areas are interdigited.

In a preferred form of the invention at least some of the active areas are elongate. In order to reduce potential sensitivity of the device to its optical input, the long sides of the photosensitive areas should not be parallel to any linear intensity variations (or "fringes") in the light input beam. In many cases interference fringes generated by a semiconducting laser in the monitored optical output will be parallel or normal to the mounting plane of the source. In such cases the elongate sides will be inclined between 30 degrees and 60 degrees for example.

Broadly speaking, the angle of orientation of the long sides should be chosen in dependence upon the likelihood of the occurrence of secondary fringes and their orientation. Thus, if their were no secondary fringes, the sides could be chosen to extend as right angles to the main fringe, the existence of strong secondary fringes as right angles to the main fringe will necessitate an angle of 45 degrees to both etc.

The selective connection may be provided by a plurality of electrical terminals comprising bonding pads, each terminal being connected to a different active area or group of active areas, and selecting from which bonding pad connections are made to an external electric circuit. Alternatively, active areas maybe provided with a breakable weak-link connection to their associated electrical terminals.

BRIEF DESCRIPTION OF THE DRAWINGS

The invention will now be described further by way of example and with reference to the company drawings of which.

DETAILED DESCRIPTION OF EXEMPLARY EMBODIMENTS

Figure 1:
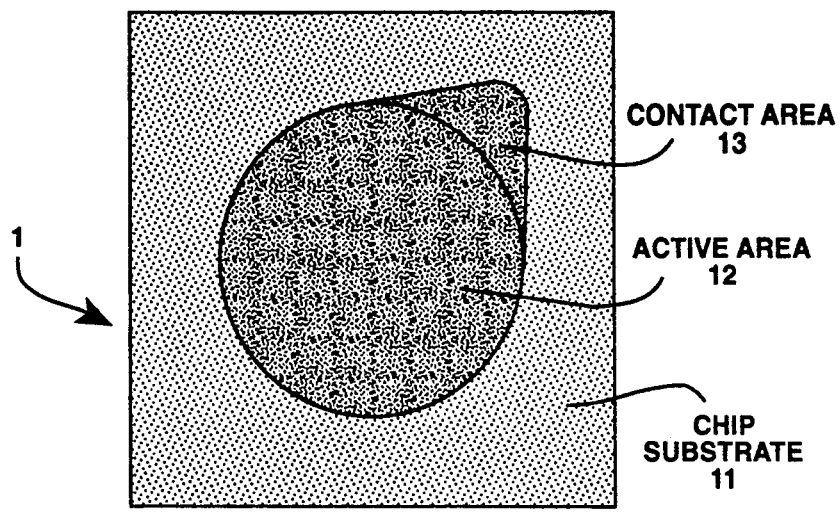
FIG. 1 is a plan view of a standard prior art monitor photodiode.

Referring now also to the drawings, FIG. 1 is a plan view of a prior art monitor diode 1. An active area 12 of approximately 250 micrometers diameter is located on a square substrate chip 11 of about 400 micrometers side length. The chip dimension is convenient for handling and for processing steps such as cleaving. A contact area 13 provides one electrical connection to the diode, the other contact being at the back of the substrate 11. The active area 12 forms all of the active region of the device.

Figure 2:
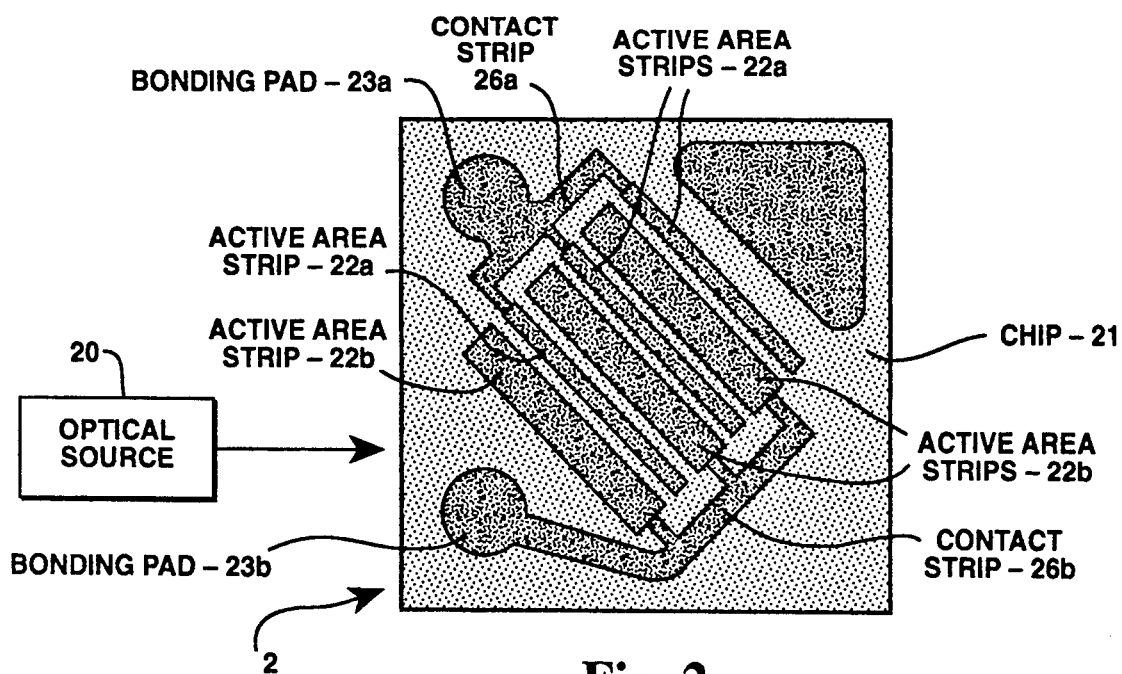
FIG. 2 is a plan view of a first embodiment of the present invention.

FIG. 2 is a plan view of a first embodiment of a photodiode according to the present invention. Located on a similar sized substrate chip 21 as the device of FIG. 1, the active region of the device 2 of Figure is divided up into several active areas 22a and 22b. Together the strips 22a and 22b form a square, inclined to the sides of the chip 21, of about 200 micrometer side length, so that the surface area over which the device is photo responsive and hence the positional tolerance of the device is similar to that of conventional photo diodes such as shown in FIG. 1.

Referring now specifically to FIG. 2, the photodetector 2 comprises a total active area made up of two sets of interdigitated active area strips, 22a and 22b of rectangular outline. The sets of strips 22a and 22b are electrically isolated from each other, and are provided with associated bonding pads 23a and 23b respectively. Either one of the sets or both sets can be connected by a connecting wire bond from the bond pads 23a, 23b to an external electrical circuit (not shown).

The set 22b comprises strips of approximately twice the width of set 22a. Since both sets of strips are of the same length set 22b has twice the photoresponsive area of set 22a.

In operation, assuming the device is uniformly illuminated, providing an external connection only to bond pad 23a, will give an electrical signal corresponding to a relative response of 1. Similarly, connecting only to pad 23b will give a relative response of 2 because the strip area is twice as large. Connecting both sets in parallel will give a combined relative response of 1+2=3.

In use, bond wires (not shown) are connected to both pads, 23a and 23b, after having mounted the monitor diode in the desired position relative to an associated optical source 20, which may be a semiconductor laser. After alignment between the laser and an associated optical fibre has been achieved, the electrical output of the device is tuned, depending on the required response, either the bond to pad 23a or the bond to pad 23b or neither bond would be broken. Thus, it can be seen that a total responsivity range of 3 to 1 is available in terms of direct response.

It will be understood that a ratio of 2:1 for the strip widths has been used as a representative example since the ratio may, of course, be varied to optimise either maximum tolerance or the total range. The interdigitation of the strips 22a and 22b will ensure that a representative sample of the laser farfield is detected. The greater the number of strips, the less effect any sharp peaks or holes in the laser farfield will have on detection. The limit on the number of strips is set by process tolerances: with three strips of each size gaps of 20 micrometers would allow very easy processing with electrical isolation by any one of the several standard methods of which some well known ones are proton implanting, channel etching, and diffusion of opposite conductivity type. Clearly, some of these techniques will work better than others in given circumstances. To increase the number of strips per set to six gaps of 10 micrometers would be required, which is more demanding but is well within the capability of current device processing technique. An even greater number of strips with narrower separation is, of course, possible, but depending on the technology used, may require improvements in the processing techniques.

The "fill factor", that is the ratio of total active strip area to gross active area (or photo-responsive region) is about 50% for the device shown in FIG. 2. This will reduce the effective peak responsivity of the monitor by 50%. In many cases such reduced responsivity is in itself an advantage in that it may avoid having to mount the monitor diode off-axis with respect to the laser output beam.

Figure 3:
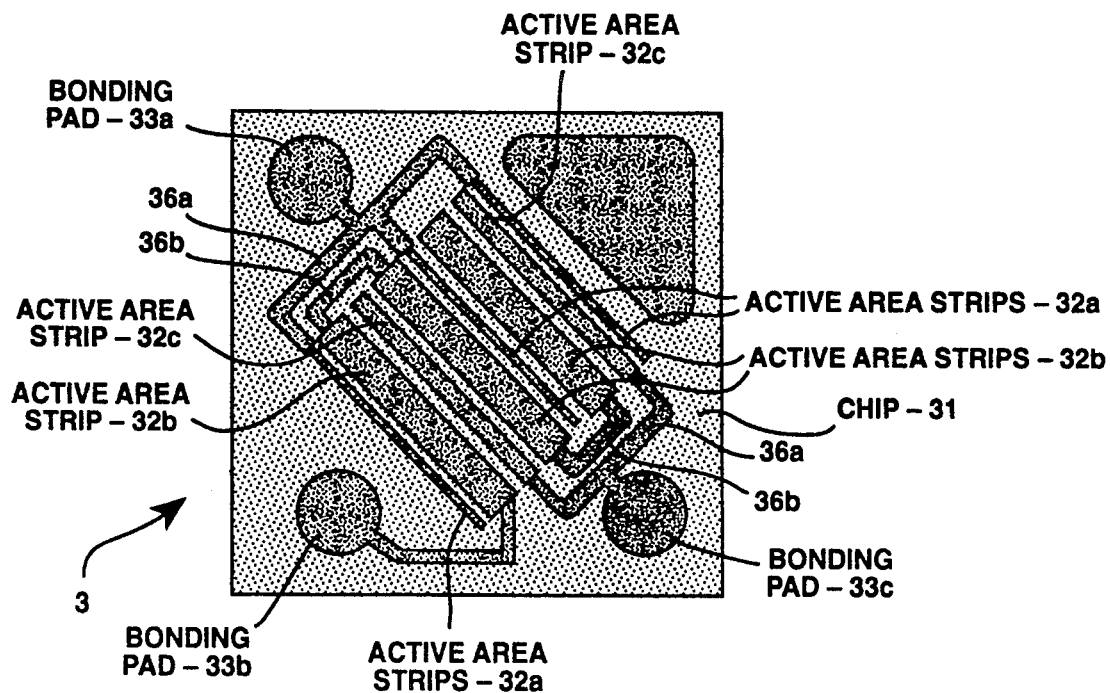
FIG. 3 is a plan view of a second embodiment of the present invention.

An alternative design, which has a further reduced fill factor, as well as a greater range of adjustability, is shown in FIG. 3. As shown in FIG. 3 the active area comprises three sets of 32a, 32b, 32c, interdigitated active strips with area ratios of 1:2:6. Each set has an associated electrical terminal provided by bond pads 33a, 33b, and 33c respectively. While the configuration of the device 3 of FIG. 3 clearly provides a greater range of adjustability, the narrower strips and/or strip separations also place greater demands on processing techniques employed in the fabrication of the device. Nevertheless, the increased complexity engendered by the greater number of strip sets 32a, 32b, 32c may be acceptable to provide the greater range of adjustability needed in cases such as backface monitors for distributed feedback lasers, for example.

It is, of course, possible to obtain a range greater than 3:1 even with just 2 sets of strips by making the strip sizes more asymmetric but at a cost of rapidly worsening tolerance on completed devices. Using more strips as shown in FIG. 3 overcomes this problem to some extent, but arranging electric connections becomes rapidly more difficult and tortuous as the number of sets increases. With the three sets of strips 32a, 32b and 32c as shown in FIG. 3 it is still possible to avoid crossovers by using a conductor pattern such as that shown in FIG. 3. The extremes of the responsivity range which can be provided by this design lie at 1 to (1+2+6)=9.

To obtain a yet larger range of responsivity four or more sets of strips (not shown) may be used. In the case of four sets it is still possible to make the electrical connection without cross-overs but using dedicated cross-over technology and accepting the extra process complexity required is likely to result in better performance. For more than four sets the use of cross-overs will almost certainly be necessary if interdigitated sets of active areas are employed.

Figure 4:
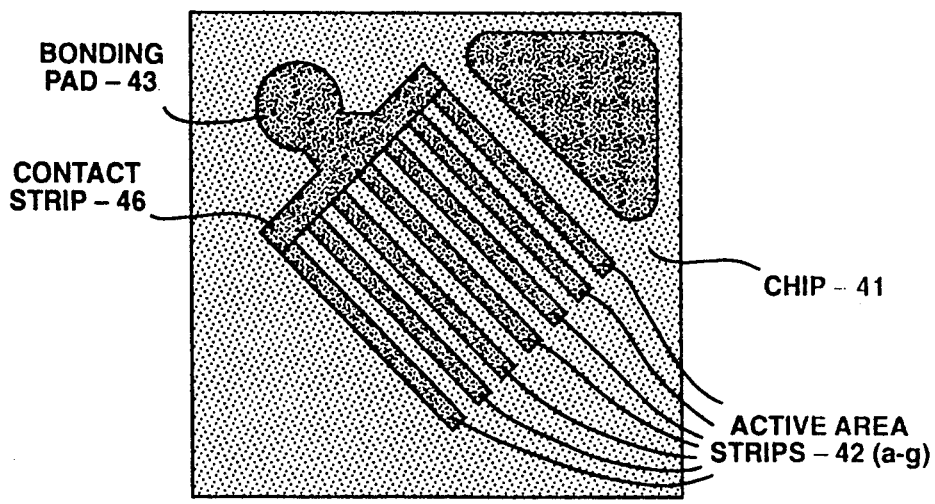
FIG. 4 is a plan view of a third embodiment of the present invention.

FIG. 4 shows device design which results in reduced device responsivity without a concomitant reduction in the active region (or gross active area) of the device. This is achieved, as shown, by dividing the active region of the device 4 into several spaced active areas formed by strips 42(a–g), thereby reducing the fill factor of the active region. All strips 42 (a–g) are electrically connected at one end by a contact strip 46 which itself is connected to a bond pad 43 providing the electrical terminal for the device 4.

Figure 5:
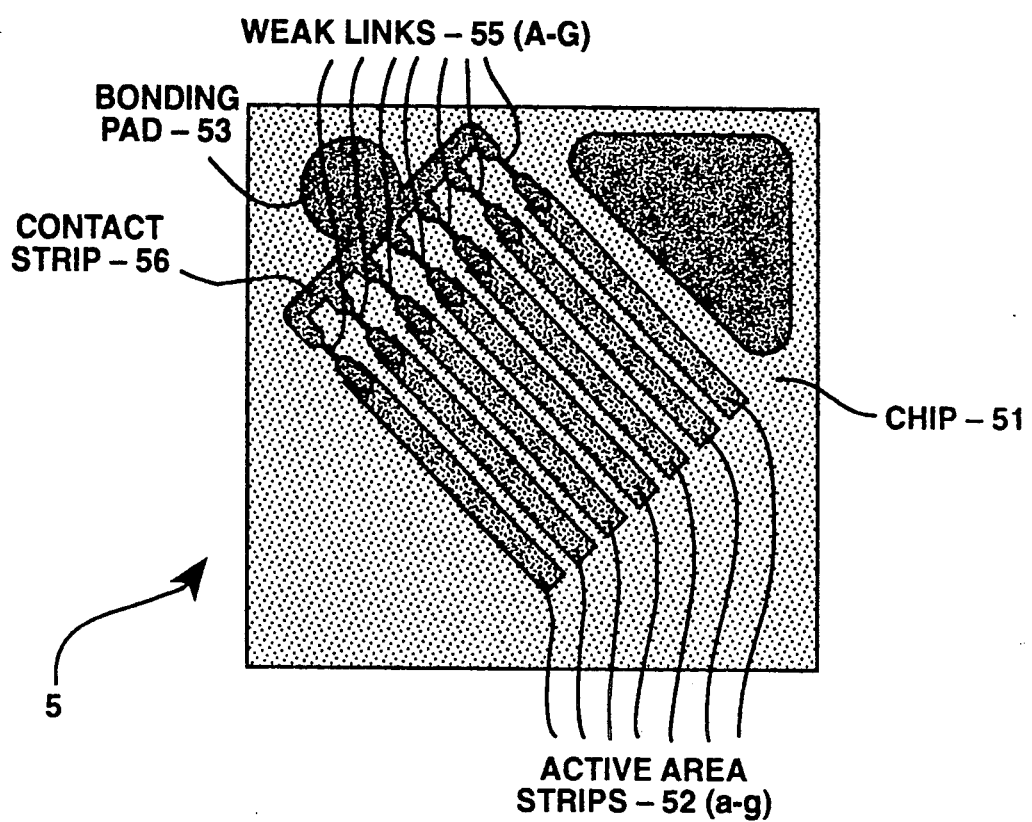
FIG. 5 is a plan view of a forth embodiment of the present invention.

FIG. 5 shows a modified device 5 as compared with the device 4 of FIG. 4. As shown, all strips 52(a–g) of the device 5 are connected together by a comb-like contact strip 56 which is itself connected, to a contact pad 53 providing the electrical terminal to the device 5. The connections between the contact strip 56 and the strips 52(a–g) incorporate in "weak links" 55(a–g) which can be broken by techniques similar to those already used widely in semiconductor ROMs (read only memories). This modification of providing breakable weak links may be applied to other device designs such as the devices 2 and 3 of FIGS. 2 and 3, for example.

In all implementations of the invention which use elongated strips, the strips are preferably inclined at 45 degrees to the substrate chip sides. Active strips (22,32,42,52) so inclined insure that their long edges are never parallel to fringes in the laser farfield caused by interference close to the emitting spot. When intensity fringes occur in a laser output they are usually due to reflections from the bond metal and therefore tend to be horizontal. In addition finer fringes are often seen in the vertical direction which are normally attributable to roughness of mesa side walls in buried heterostructure lasers. It is very rare to see linear features in laser far-fields which are inclined at 45 degrees to these principal axes.

One of the key advantages of the present invention is that there is no increase in the total number of masks required during device processing as compared with prior art monitors, nor are extra processing steps required, save in the case of very complex strip configurations requiring compact cross overs.

I claim:

1. A photo-diode photo-detector having a photo-sensitive region which comprises a plurality of distinct photo-diode active areas, each active area having plural electrically connected subareas distributed over said photo-sensitive region and means for selectively enabling or disabling one or more of the active areas.

2. A photo-diode photo-detector as in claim 1, wherein said means for selectively enabling or disabling includes means for respectively making and breaking electrical connection between at least one active area and another active area or an electric terminal arrangement, or both.

3. A coherent optical source in combination with a photo-diode photo-detector according to claim 1.

4. A photo-diode photo-detector as in claim 1 comprising a first active area of larger surface area than another active area.

5. An optical source comprising a semiconductor laser light source, and a photo-diode photo-detector according to claim 1, wherein the photo-detector is mounted in relation to the semiconductor laser light source such that light from the laser light source is incident on it.

6. A coherent optical source including a monitor photo-diode photo-detector according to claim 1.

7. A photo-diode photo-detector according to claim 1 wherein different groups of active areas are interdigitated.

8. A photo-diode photo-detector according to claim 1, wherein at least some of the active areas are elongate.

9. A photo-diode photo-detector as in claim 1, wherein the active areas have boundaries inclined at an angle across planes of interference fringes in the output of an associated coherent light source.

10. A photo-diode photo-detector as in claim 9 wherein the angle is between 30 and 60 degrees.

11. A photo-diode photo-detector as in claim 10 wherein the angle is approximately 45 degrees.

12. A photo-diode photo-detector according to claim 1, wherein the means for selective enabling or disabling comprises a plurality of electrical terminals comprising bonding pads, each terminal being connected to a different active area or group of active areas.

13. A photo-diode photo-detector according to claim 1 wherein a breakable weak-link electrical connection is made to at least some of said active areas.

14. A photo-diode photo-detector according to claim 1 disposed as a monitoring detector for a coherent optical source.

15. A photo-diode photo-detector having a plurality of active photo-diode areas in a photo-responsive region such that the ratio (the fill factor) of the total active area to the total surface area of the photo-responsive region is less than 1, each of said active areas including plural electrically connected sub-areas distributed over said photo-responsive region.

16. A photo-diode photo-detector as in claim 15 including means for enabling or disabling an electrical output of selected areas or groups of areas or both to provide respectively different photo responsivity.

17. A photo-diode photo-detector as in claim 15 wherein active areas are electrically connected together in one or more groups.

18. A method of adjusting the electrical output of an optical source including a photo-diode photo-detector having a plurality of active areas, comprising the step of selectively making or breaking electrical connection between an output port of the photo-detector and one or more active areas of the photo-detector.

19. A photo-diode photo-detector comprising:
a plurality of non-overlapping separated photo-sensitive active photo-diode areas distributed over a photo-responsive region of a semi-conductor substrate; and
electrical contact strips also disposed on said substrate and electrically interconnecting at least one group of said active photo-diode areas to at least one terminal bonding pad on said substrate.

20. A photo-diode photo-detector as in claim 19 wherein at least some of said electrical contact strips include fusible links therein to permit selective disconnection of respectively associated active photo-diode areas.

21. A photo-diode photo-detector as in claim 19 wherein some of said active photodiode areas are larger than other active photo-diode areas.

22. A photo-diode photo-detector as in claim 19 including:
a plurality of terminal bonding pads disposed on said substrate;
said electrical contact strips including plural independent non-interconnected portions which each electrically connect a respectively corresponding group of said active photo-diode areas to one of said terminal bonding pads.

23. A photo-diode photo-detector as in claim 22 wherein the active photo-diode area of at least one said group is larger than that of another said group.

24. A photo-diode photo-detector as in claim 19 wherein each of said active photo-diode areas includes an elongated approximately rectangular area.

25. A photo-diode photo-detector as in claim 24 wherein each said active photo-diode area includes a longitudinal axis that is inclined at an angle with respect to an edge of said substrate.

26. A photo-diode photo-detector as in claim 25 wherein said angle is in the range of 30 degrees to 60 degrees.

27. A photo-diode photo-detector as in claim 24 including:
a plurality of terminal bonding pads disposed on said substrate;
said electrical contact strips including plural independent non-interconnected portions which each electrically connect a respectively corresponding group of said active photo-diode areas to one of said terminal bonding pads.

28. A photo-diode photo-detector as in claim 27 wherein the active photo-diode areas of the plural groups are mutually interdigitated on said substrate.

* * * * *